United States Patent
Reindl et al.

(10) Patent No.: US 6,455,979 B2
(45) Date of Patent: Sep. 24, 2002

(54) SURFACE ACOUSTIC WAVE COMPONENT WHICH CAN BE INTERROGATED BY RADIO AND HAS AN OPTIMUM CODE SIZE

(75) Inventors: Leonhard Reindl, Clausthal-Zellerfeld; Frank Schmidt, Poering; Oliver Sczesny, Aschheim; Martin Vossiek, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/891,187

(22) Filed: Jun. 25, 2001

Related U.S. Application Data

(63) Continuation of application No. PCT/DE99/04079, filed on Dec. 22, 1999.

(30) Foreign Application Priority Data

Dec. 23, 1998 (DE) .......................... 198 60 058

(51) Int. Cl.[7] .............................. H03H 9/15; G01S 13/75
(52) U.S. Cl. .............................. 310/313 D; 310/313 C; 310/313 R; 340/572.1; 342/51
(58) Field of Search .................. 310/313 C, 313 D, 310/313 R; 340/572.1; 342/51

(56) References Cited

U.S. PATENT DOCUMENTS

| | | | | | |
|---|---|---|---|---|---|
| 4,434,481 A | * | 2/1984 | Toda et al. | ............. | 310/313 R |
| 4,484,160 A | * | 11/1984 | Riha | ..................... | 310/313 D |
| 4,625,208 A | * | 11/1986 | Skeie et al. | ............. | 310/313 D |
| 4,734,698 A | * | 3/1988 | Nysen et al. | ................ | 342/174 |
| 4,951,057 A | * | 8/1990 | Nagel | ......................... | 342/44 |
| 5,691,698 A | * | 11/1997 | Scholl et al. | ............ | 310/313 B |
| 5,841,214 A | * | 11/1998 | Schmidt et al. | .......... | 310/313 D |
| 6,297,747 B1 | * | 10/2001 | Magori et al. | .............. | 333/150 |

* cited by examiner

*Primary Examiner*—Thomas M. Dougherty
(74) *Attorney, Agent, or Firm*—Laurence A. Greenberg; Werner H. Stemer; Ralph E. Locher

(57) ABSTRACT

A coding scheme is specified which, compared to the prior art and with the system having a structure resolution of the same magnitude, allows an enlarged code size for the same number of code elements, and/or by which fewer code elements are required per code for a predetermined code size. The code elements are disposed with basic values in a matrix defined in a novel manner, with the matrix having a finer subdivision of the basic values than the subdivision corresponding to the structure resolution. Further development with mean-value formations are possible.

17 Claims, 4 Drawing Sheets

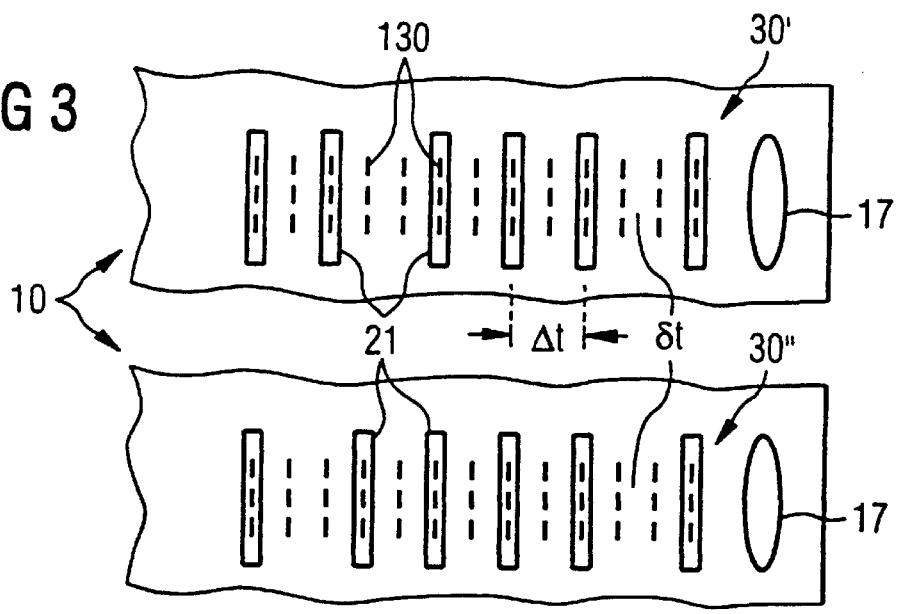
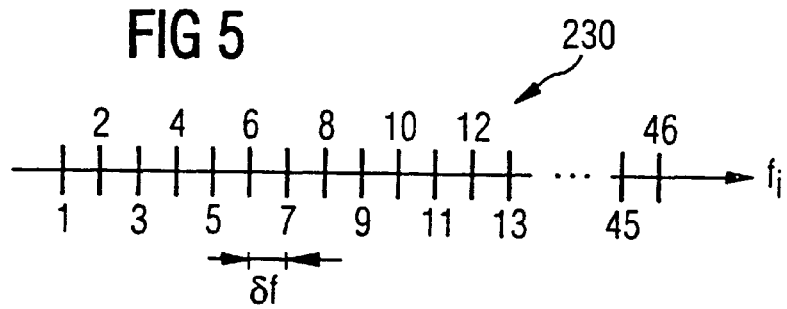
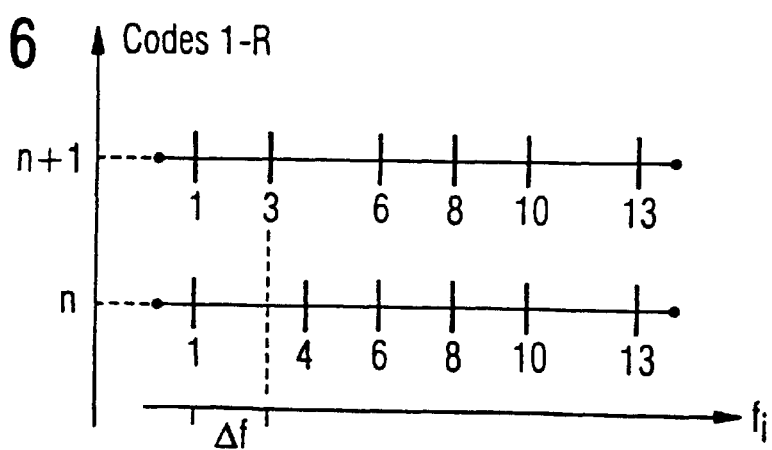

SURFACE ACOUSTIC WAVE COMPONENT WHICH CAN BE INTERROGATED BY RADIO AND HAS AN OPTIMUM CODE SIZE

CROSS-REFERENCE TO RELATED APPLICATION

This application is a continuation of copending International Application No. PCT/DE99/04079, filed Dec. 22, 1999, which designated the United States.

BACKGROUND OF THE INVENTION

Field of the Invention

The present invention relates to a coded surface acoustic wave component which can be interrogated by a radio, as is known in principle from the prior art (see U.S. Pat. Nos. 4,263,595, and 5,469,170, 1995 IEEE Ultrasonics Symp., pages 117–120, and International Patent Disclosures WO 96/14589, WO 97/42519, and WO 97/26555).

In terms of its physical configuration, a surface acoustic wave component contains a substrate wafer formed from a piezoelectric material or a material with a piezoelectric coating. At least one interdigital structure is disposed as a piezoelectric transducer on or in its surface/coating having the piezoelectric characteristic. When the structure elements of the transducer are electrically excited appropriately, the transducer results in an acoustic wave, which is generally referred to as a surface acoustic wave, being produced in the surface of the substrate. The surface acoustic wave has a movement direction/form there that is governed, as is known, by the interdigital structure. Such a structure defines a main wave propagation direction in the plane of the surface.

In a manner corresponding to a surface acoustic wave component which can be interrogated by radio, the surface acoustic wave in the component can be excited by the transducer being excited/fed by radio. To this end, the transducer is equipped with an appropriate antenna for radio reception and, generally, also for radio return transmission of a response signal from the transducer to a receiver. A separate transducer with an antenna can also be provided for the interrogation signal.

The interrogation signal is transmitted by a transmitter which can transmit with a minimum bandwidth which can be predetermined. The radio signal transmission can be carried out using, for example, an apparatus that can use thermal and/or mechanical energy to produce a radio-frequency pulse with the aid, for example, of a nonlinear electronic component, like a radio path. Details of this are known.

The receiver which is provided for the radio response signal transmitted back from the component must be configured, as is known, particularly in terms of its bandwidth to satisfy the requirements of the system operating with the surface acoustic wave component.

In the case of surface acoustic wave components which are used for identification, it is necessary to ensure that a received signal can be uniquely associated, as a response signal, with a predetermined surface acoustic wave component which is appropriately individually coded for this purpose, where a system contains a number of such components which can be interrogated but are coded differently from one another, and/or where other signals are received which arrive in the system receiver in some other way.

It is thus known and normal practice for such surface acoustic wave components which can be interrogated by radio to be provided with respective individual coding, which makes it possible to distinguish the individual components from one another uniquely in the respective received signal within a large number of such surface acoustic wave components contained in the system.

First of all, two examples should be cited of the application options for such coded surface acoustic wave components that can be interrogated by radio. One of these examples is for such a surface acoustic wave component with coding to be fitted, for example, to an object that can be identified in an appropriate manner by the component or its coding. Such components are also known as ID tags. Another example is where the surface acoustic wave component has the additional characteristic, or is equipped with such an additional characteristic, as a sensor for, for example, measuring a temperature, a force variable and/or other physical, chemical or such like state variables. Such applications and refinements of a surface acoustic wave component relating to them are known.

Various principles are possible for producing a coded radio response signal from an interrogation signal. One example is to provide reflector elements for the coding, which are disposed such that they are managed in a known manner to the configuration of the already mentioned interdigital structure of the transducer. Such reflector elements are generally strip elements, which are provided on/in the surface of the substrate wafer in the path of the main wave propagation direction of the surface acoustic wave. As a further example for code elements and instead of such the reflector elements, resonators can also be assigned to the transducer or transducers, and they will also be described further below.

An individual reflector element produces a surface acoustic wave component response signal that is shifted in time with respect to the interrogation signal, that is to say with respect to the transmitted pulse. A component which, instead of this, is provided with resonators produces a response signal at an appropriate specific (resonant) frequency. A respective large number of reflectors disposed in different positions (with respect to one another and with respect to the transducer) produce a corresponding large number of pulse response signals shifted differently in time, with the mutual time shifts being dependent on the positions of the relevant reflectors with respect to one another. A corresponding situation applies to the various response resonant frequencies for a respective number of different resonators provided for different frequencies.

The response signal to be produced by the surface acoustic wave component in response to a radio interrogation signal is thus, in the case of reflectors, an additive superimposition of response signal elements offset in time with respect to one another or, in the case of resonators, an additive superimposition of a correspondingly large number of sinusoidal, limited-time (generally exponentially decaying) response signal elements at frequencies which differ from one another. A respective surface acoustic wave component is normally identified by determining the reception times corresponding to the selected positions of the individual reflectors in the relevant component. The resonator principle results in amplitudes in the received spectrum at frequency support points that correspond to the selected resonant frequencies of the individual resonators. The coding or the impressed code of a relevant reflector-coded surface acoustic wave component thus physically/structurally contains coded positioning of the individual reflectors that are provided, with respect to a reference reflector element or with respect to the position of the transducer on the surface of the substrate wafer. When resonators are used for coding, the various resonant frequencies, which are provided in a selective manner, of the individual resonators result in the code impressed on the respective component.

One problem that is associated with this is that the structure resolution of the associated measurement system is always limited. In this case, structure resolution refers to the capability of the system (in this case essentially containing the transmitter, the surface acoustic wave component and the receiver) to identify two reflection or resonant response signal elements from two reflectors disposed immediately adjacent to one another on the substrate wafer or from two resonators with immediately adjacent resonant frequencies, as being two response signal elements, which are separated from one another, in each case. In systems with time measurement (reflectors), the time structure resolution ($\Delta t$) is inversely proportional to the spectral bandwidth B used for the system/the measurement, that is to say $\Delta t$ is proportional to 1/B.

In a system using frequency measurements (resonators), the relationships are in principle analogous, that is to say, in this case, the structure resolution, $\Delta f$ is in this case based on the quality of the system, that is to say it is inversely proportional to the time duration t of the measurement signals ($\Delta f$ is proportional to 1/t). For normal measurement signals with a Gaussian envelope, the proportionality factor is approximately 0.5.

The fundamentally limited structure resolution results in that all the code elements in the case of reflectors must be at a minimum distance from one another and, in the case of resonators, must have a corresponding minimum interval between mid-frequencies since, otherwise, the signal components from elements (reflectors or resonators) respectively adjacent in terms of position or frequency would be superimposed in the response signal such that reliable evaluation (identification) of a code of a relevant component would no longer be possible.

Purely for the sake of completeness, it should be mentioned that more far-reaching coding options can, additionally, also be provided for the invention, which is still to be described in the following text. For example, codes with a base higher than 2 can also be used instead of a binary system (reflector present/reflector not present). One possibility for achieving this is to provide a number of amplitude thresholds/steps for a respective code element. Another possibility is (additionally) to evaluate (in steps) the phase difference between two signals from two code elements.

Depending on the required code size, the known type of coding is to dispose a greater or lesser number of reflector strips distributed in terms of position along the main wave propagation direction of the surface acoustic wave produced by the transducer, on the surface acoustic wave component. For example, for a code size of 32 bits, it is known as prior art for 32 spaces, located one behind the other in the direction of the main wave propagation direction, to be provided for up to 32 reflectors to be positioned there. Thus, for a structure resolution (measured on the basis of the delay time=path length s divided by the speed v of the acoustic wave) of the system of 1 µs, a delay time length of 31 µs, that is to say from the first bit to the 32nd bit, is thus required for the dual coding for the configuration of the reflectors. Therefore, the substrate wafer required for the component must have a considerable length. This is associated with technical problems that will also be discussed in the following text, in conjunction with the invention. Reference should also be made to the detailed description provided (further below) with regard to the use of resonators as code elements.

SUMMARY OF THE INVENTION

It is accordingly an object of the invention to provide a surface acoustic wave component which can be interrogated by radio and has an optimum code size which overcomes the above-mentioned disadvantages of the prior art devices and methods of this general type. The object of the invention is, for a predetermined, in particular large, code size, to manage with a shorter/smaller (compared to the prior art) substrate wafer length/size and/or with as few code elements per individual code as possible. In other words, the aim is to find a coding scheme for a predetermined code size which manages with an optimally small number of code elements per code and which, furthermore, are disposed on an individually selected basis, on a shorter/smaller substrate wafer length/area.

With the foregoing and other objects in view there is provided, in accordance with the invention, a coded surface acoustic wave component for an ID tag radio interrogation system. The coded surface acoustic wave component contains a substrate wafer having a surface with a piezoelectric material characteristic, and at least one electroacoustic transducer having an interdigital structure disposed on the surface of the substrate wafer. The electroacoustic transducer produces a surface acoustic wave in the surface with a main wave propagation direction governed by the interdigital structure. A reflector structure having reflectors functioning as code elements are spaced apart from one another in the main wave propagation direction on the surface of the substrate wafer. The substrate wafer has a position matrix for positioning the reflectors at correct distances apart. The position matrix has basic values at equal distances from one another aligned in the main wave propagation direction. In the position matrix, a size of a matrix spacing is dimensioned on a basis of a movement distance which the surface acoustic wave travels within a time period predetermined by a time-dimensioned measurement inaccuracy of a system. And of the basic values of the position matrix, only the basic values occupied by the reflectors as positions distributed corresponding to a respective code are those for which distances between adjacent reflectors are always at least of equal magnitude to a structure resolution resulting from a frequency bandwidth of the system.

With the foregoing and other objects in view there is further provided, in accordance with the invention, a coded surface acoustic wave component for an ID tag radio interrogation system. The coded surface acoustic wave component containing a substrate wafer having a surface with a piezoelectric material characteristic and electroacoustic transducers having interdigital structures disposed on the surface of the substrate wafer. The elecrtoacoustic transducers produce surface acoustic waves in the surface with main wave propagation directions governed by the interdigital structures. Resonator structures are provided and function as code elements each having a resonant frequency. The resonator structures each with respect to a respective one of the electroacoustic transducers, are disposed in a respective main wave propagation direction thereof. The resonator structures are formed according to a frequency matrix having frequencies at equal intervals from one another as basic values of the frequency matrix for determining individual resonant frequencies of the resonator structures. A size of a frequency interval between the basic values within the frequency matrix is dimensioned on a basis of a measurement inaccuracy with which a frequency can be measured in a system. And in the frequency matrix the resonant frequency for each of the resonator structures is selected such that, within the frequency matrix, only resonant frequencies which are used for the resonator structures are those that a respective frequency separation between two of the resonator structures provided for adjacent resonant frequencies is at least of equal magnitude to a structure resolution of a frequency measurement resulting from a resonance duration of an individual resonator in the system.

A novel position or frequency distribution, which forms the respective codes, is provided for the novel coding principle according to the invention and (in this case explained first of all for the case of position distribution of reflectors, in the following text) allows a greater number of different codes for a given structure resolution, as defined above. In order to remain with the abovementioned example, and in the case, for example, of the surface acoustic wave component and its associated system (in particular the receiver which evaluates the signals) having a structure resolution of, for example, 1 $\mu s$, and with the acoustic wave having a delay time of 31 $\mu s$ of the abovementioned length, the invention results in a code size (17 167 680 177 565 codings) increased by a factor of around 4000 times in comparison to the $2^{32}$ different codings available in the prior art, which corresponds approximately to a code size of 43 bits based on known codings. In order, instead of this, to allow the above code size of 32 bits to be used with the measure according to the invention specified in the following text, the invention in each case requires only 23 reflectors (resonators) to be fitted for each individual one of the codes, for which the considerably shorter substrate wafer length corresponding to a delay time of 22.5 $\mu s$ is then sufficient. The above numerical comparison is only one example of the advantage that can be achieved by the invention. If it is assumed that the delay time measurement in the case of reflectors (or the frequency measurement in the case of resonators) in the system is subject to even smaller measurement inaccuracy, this can even be chosen to be many times greater still so that, for example, the known 32-bit coding, in each case having only a maximum of 20 reflectors fitted per code, can then be generated even with a length of 19 $\mu s$.

Further exemplary notes will now be provided primarily with respect to and on the basis of the configuration of a component according to the invention with reflectors (=coding in the time domain), and this will be followed, further below, by additional information relating to the embodiment with resonators (=coding in the frequency domain).

Accordingly, the characteristic of the measurement inaccuracy of the system for delay-time measurement or frequency measurement was made use of, and was introduced here, for the known structure resolution A defined above. The measurement inaccuracy denotes the random and systematic error with which the delay time/frequency value measured using the system differs from the actual delay time/frequency value of the physical structure. The time position of a reflector or the frequency of a resonator can be defined accurately only within an interval, which is referred to as the measurement inaccuracy, owing to the inaccuracy of the measurement carried out in or using the system. The magnitude of the measurement inaccuracy $\delta$ in systems with a surface acoustic wave component is generally considerably smaller than the magnitude of the structure resolution. The measurement inaccuracy can be reduced even further by averaging over a number of measurements if the measurement errors are random, or by calibration procedures in the case of systematic errors, and this will also be described further below.

According to the invention, the magnitude $\delta$ is used to form the respective position matrix with equidistant matrix intervals $\delta t$, or the frequency matrix with identical frequency matrix intervals $\delta f$ for the coding, corresponding to the teaching of the invention.

The principle of the invention is, despite the available structure resolution $\Delta$, for example, which is still constant and wide as provided by the bandwidth, to dispose the reflectors according to the invention in such a position matrix and, in order to allow the position of a respective reflector to be determined uniquely despite the limited structure resolution, to provide that the matrix spaces in a position matrix are occupied only in such a manner that spaces which are adjacent to one another in the position matrix are occupied when there is no code, that is to say when there is no code configuration. If, for example, the measurement inaccuracy of the delay time measurement is dimensioned to be half as great (for example $\delta t=0.5$ $\mu s$) on a time scale as the structure resolution $\Delta$ (for example 1 $\mu s$) measured on the same time scale, then the rule according to the invention provides for at least one space in the matrix to remain unoccupied between two occupied spaces in the position matrix. If, for example, the variable $\delta t$ is in fact only $\frac{1}{3}$ as great as the structure resolution, this would result in the position matrix being subdivided three times as finely as a matrix whose size matches the structure resolution. Although, in accordance with the rule according to the invention, at least two spaces in the position matrix must then remain unoccupied between two adjacent occupied reflectors of the code, namely once again due to the limited structure resolution, the code size of the principle according to the invention then nevertheless rises, however, to $5 \times 10^{15}$ codings with, for example, 32 fitted reflector positions for the individual code. The code size of the above 32-bit coding would in this case be capable of being generated with a maximum of only 20 fitted reflectors per code on a chip length which is now only 19 $\mu s$.

For the invention, the above statements also apply in the same sense when resonators are used as code elements instead of the reflectors, as will be explained in more detail further below.

A development of the invention provides for an equal number of code elements, that is to say reflectors or resonators, always to be provided as standard in each individual one of the components for the single individual codes/(coding options) for the single individual components within the group of components of a predetermined overall code size. For the surface acoustic wave component, therefore as, seen from the transducer and with regard to the propagation of the acoustic wave, the wave is always attenuated to the same extent, and a faulty code is identified from there being a different number of received signal elements. According to this development of the invention with a constant number of code elements, the code elements are just disposed distributed differently in the position matrix for the respective codes. The entire position matrix has a standard—compared to the prior art—optimally short length, thus allowing a short component dimension.

If the measurement inaccuracy is even lower (for example, as mentioned above, 0.33 $\mu s$), the code size and the number of coding options with a predetermined number of code elements per code for reflectors can be increased even further for a predetermined length and for resonators on a predetermined surface of the component chip. Conversely, if the measurement inaccuracy is reduced even further for a given code size the number of code elements required per code and/or the required length or area of the substrate wafer of the component can be reduced.

In other words, the idea of the invention can also be described as follows. A matrix according to the invention is formed for the code elements of the individual codes of the code size. For reflectors, this is a position matrix, and for resonators, as code elements, is a frequency matrix. In the relevant matrix, the matrix basic values are at equidistant (position or frequency) basic intervals δg from one another.

The intervals are dimensioned on the basis of the measurement inaccuracy of the system, in which a delay time or a frequency can be measured with an error δ (δt for delay time measurement; δf for frequency measurement).

In a matrix according to the invention, the intervals are optimally dimensioned to be of equal magnitude or else greater than the magnitude δ.

However, according to the invention, the only basic values (positions/frequencies) which are in each case "occupied" by code elements are those for which the intervals between code elements positioned in such a manner are equal to or greater than the structure resolution Δ of the overall system. If the measurement inaccuracy is δ=0.5 μs or 0.33 μs, the intervals Δ, which are required according to the invention, between positioned reflectors as code elements are each 1 μs, measured on a time scale for a structure resolution of 1 μs. The major difference from the prior art is that a position matrix, which is several times finer in a corresponding manner, is available for the fitting of reflectors as code elements by using the smaller dimension than the structure resolution. If the structure resolution Δ remains unchanged, it is thus possible, with a constant number of code elements per code, to achieve a greater code size, or to achieve the previous code size with fewer code elements per code. The division ratio between the structure resolution and the selected matrix size may also be other than an integer (greater than 1).

If this teaching relating to the technical craft is applied to surface acoustic wave components coded using resonators, this results in the following analogy. Instead of R reflectors, the number R of resonators are provided and disposed on the substrate wafer of the respective surface acoustic wave component (which forms part of the predetermined code size). The R resonators have resonant frequencies $f_i$, where i=1 to R, which each differ from one another. The matrix for selection of these frequencies $f_i$ is the frequency matrix according to the invention with its basic values f, for example 1 to 46. These have an equidistant interval δf. The basic interval of the resonant frequencies available for coding (subject to a restriction which will be mentioned in the following text) is dimensioned in such a manner that it is greater than or, optimally equal to, the magnitude of the measurement inaccuracy δf with which it is possible to measure an individual frequency in the system containing the transmitter, the receiver and the component. In a comparable manner to the situation with reflectors, in this case as well, the only resonant frequencies $f_i$ which may be selected for resonators to be used as code elements, within the matrix, from the (for example 1 to 46) basic value frequencies in the matrix, according to the invention, are those for which the intervals between adjacent selected resonant frequencies ($f_j$, $f_{j+1}$) of two resonators are in each case greater than or optimally equal to the structure resolution, that is to say the frequency resolution Δf of the overall system, including the natural bandwidth of these resonators, which results from their quality factor.

The following calculation rule can be used to calculate the code size. It is assumed that P is the number of basic values per interval in the structure resolution Δ (p·δ=Δ). For example, P=2 for the example with a measurement inaccuracy of 0.5 μs and a structure resolution of 1 μs. P=3 for the example with a measurement inaccuracy of 0.33 μs and a structure resolution of 1 μs once again. It is assumed that the code size Cu for the number R of respective code elements (that is to say Cu{R}) and for the number of code elements R+P−1 (Cu{R+P−1}) are given. The code size (Cu{R+P}) is then obtained from the sum, that is to say (Cu{R+P}= (Cu{R}+(Cu{R+P−1}). If, in consequence, the code size for P successive numbers of code elements (Cu{R}), (Cu{R+1}), . . . (Cu{R+P−1}) is known, then the code size can be calculated successively for all the subsequent numbers of code elements.

The code size can also be increased even further when resonators are used as code elements, provided the receiving unit is additionally configured such that it allows determination of the amplitude and/or phase or frequency position of the received signal elements of the individual code element resonators. In this case, the amplitude or the phase, or else both types of information, can also additionally be used, in accordance with a principle which is once again known per se, for additional expansion of the code size.

If the structure of the code elements is also intended to be used for sensory measurement purposes (as already mentioned above) as well, then it may also be advantageous not to dispose the possible positions of the reflectors or frequencies of the resonators exactly in the equidistant matrix according to the invention, but to introduce defined discrepancies in the code element position (frequencies), so that the intervals/frequency intervals between the code elements are not exactly equal to the equidistant matrix. This avoids all the reflectors or resonators supplying information which is redundant in a sensory manner. In this type of embodiment, of course and as before, care must be taken to ensure that all the position and frequency intervals between code elements are, according to the invention, at least not less than the structure resolution Δ (1 μs for example, above) of the overall sensor system. To achieve this, it is then possible either to dimension the basic interval δ to be larger (as a minimum), or fewer codes can be provided.

The type of coding of the surface acoustic wave component according to the invention offers, inter alia, a number of advantages which are described in the following text, for example also with respect to the technical implementation and configuration on the surface acoustic wave component. The type of coding according to the invention is, for example and in contrast to multiphase coding, dependent, within limits, on changes to the speed with which the surface acoustic wave propagates in the component. For example, an ID tag with a mid-frequency of 434 MHz, a structure resolution of 1 μs and a number of P=4 reflectors per interval Δ will be used for comparison. In this case, 4-stage phase coding (4 PSK modulation) has a comparable code size to the coding carried out according to the invention, which may be referred to as pulse position modulation. With this mid-frequency, the minimum structure resolution with 1 μs is 434×λ. With the known 4 PSK modulation, two adjacent states are separated by a phase angle of 90°, that is to say ¼ λ. A variation in the time position of a reflector by only 0.25 λ: 434 λ=1 μs: 1736, for example caused by a position inaccuracy in the production of the component or due to a discrepancy in the speed of the surface acoustic wave of the component, thus on its own leads to intolerable corruption of the response signal, and thus to faulty identification. In the case of a component with coding in the same way as that according to the invention, such an error would occur only if the position of a reflector were incorrectly positioned by 0.25 s within the matrix. Only then would comparable corruption of the signal occur for a surface acoustic wave component coded according to the invention. This shows that a surface acoustic wave component with coding carried out according to the invention is thus less sensitive by a factor of 400 to fluctuations in the surface acoustic wave speed and/or positioning errors, comparable to the the PSK modulation. Apart from this, this is also apparent from the fact that the type of coding according to the invention is an extremely robust multivalue coding for a surface acoustic wave component. This is associated with major advantages, which also affects the production of a respective component coded according to the invention.

The above text is based on a respective magnitude $\delta$ for the measurement inaccuracy, which is smaller to a greater or lesser extent than the structure resolution $\Delta$ of the system, for the matrix intervals $\delta t$ and $\delta f$ of the position matrix/frequency matrix according to the invention or used according to the invention. In this case, the magnitude of the value $\delta$ is chosen, for example, on the basis of experience or measurements obtained when working with surface acoustic wave elements. The object of a development of the invention is to specify measures using which a (small) measurement inaccuracy magnitude $\delta$ to be achieved can be achieved deliberately in a manner which can be predetermined, specifically in order to make it possible to use the invention described above as optimally as possible.

In accordance with an added feature of the invention, the substrate wafer has a minimum physical length in a direction of the position matrix resulting from the interdigital structure of the electroacoustic transducer and the predetermined code size with regard to the position matrix.

In accordance with another feature of the invention, the code elements can be additionally weighted for enlarging a code size.

The object is achieved by an advantageous way of carrying out the process of reading a respective code of a respective coded surface acoustic wave component. The process of reading provides for the respective code to be read a number of times successively, that is to say for the respective individual code elements to be measured a number of times in a corresponding manner. The time dimension t for the position of the respective individual reflector or the frequency of the respective individual resonator is thus detected by measurement, that it is to say it is measured, by the interrogation signal. The multiple reading of the individual code elements of the respective code is carried out in an extremely rapid sequence in the course of the correspondingly multiple reading of the code. This results in data records that contain the multiple measurement results of the respective individual code element. A data record of the same type is obtained for each code element of the code that is read. The data records are analyzed to produce the magnitude of the standard deviation or some other measure that describes the statistics or the inaccuracy of the individual measurements within the respective data record. If there are an appropriate number of measurements, a respective mean value is obtained (for the reflector position or for the resonant frequency of the resonator), or else some other representative position/frequency mean value with a measurement inaccuracy which may be used as the basis for the measurement inaccuracy $\delta$ used and defined according to the invention.

If the above multiple reading of the code elements of a respective code has resulted in a, for example predetermined, measurement inaccuracy $\delta$, that is to say a predetermined matrix size $\delta t$ or $\delta f$, even being undershot by a certain amount, then this increases the probability of the respective code element, is to say the reflector position/resonant frequency, having been measured correctly, that is to say the entire code which has been read has been read correctly. This development, which relates to the way in which the reading process is carried out with multiple reading and averaging, results in an evaluation in which all the random inaccuracies which are inherent in any measurement are reduced to a (sufficiently) small level.

In the process of averaging the measured values, as described above, it is also possible to carry out, in a manner comparable to this, a calibration to overcome any systematic errors. To do this, the surface acoustic wave component needs to have at least two reference elements, for example comparable to the code elements. These may be reference reflectors or reference resonators, for example in the form of a start element and/or a stop element in addition to the described code elements. The reference elements are disposed independently of the matrix at known positions, or as resonators with known resonant frequencies, on the surface acoustic wave component. By comparison of the measured and possibly also still averaged measured values of the reference elements with their respectively predetermined known values, for example comparison of measured time/frequency difference between the start and the stop element with the structurally predetermined known difference and/or comparison of the measured values of the positions/frequencies of the start element and stop element with their respective known actual positions/frequencies, a scaling factor and/or an offset value can be derived, using which (using both of which) all the time/frequency measured values of the code elements can be corrected. In this case, it is also advantageous to carry out the calibration process a number of times and to average the result over a number of measurements in each case, until assurance is obtained that the (reduced) inaccuracy of the position/time or frequency values achieved in this way is even less, by a specific amount, than the/a predetermined level of the measurement inaccuracy $\delta$.

The averaging process described above or the above calibration, or else both measures, can also advantageously be carried out as a development of the invention.

Other features which are considered as characteristic for the invention are set forth in the appended claims.

Although the invention is illustrated and described herein as embodied in a surface acoustic wave component which can be interrogated by radio and has an optimum code size, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1a is a block diagram of a component in a radio interrogation system;

FIG. 3 is a plan view of two surface acoustic wave components with different codes for one code size, and each having the same number of reflectors as the code elements;

FIG. 5 is a frequency matrix, defined according to the invention, with its individual resonant frequencies which are available for (restricted) selection; and FIG. 6 is an example of two different codes in the frequency matrix.

DESCRIPTION OF THE PREFERRED EMBODIMENTS

Figure 1:
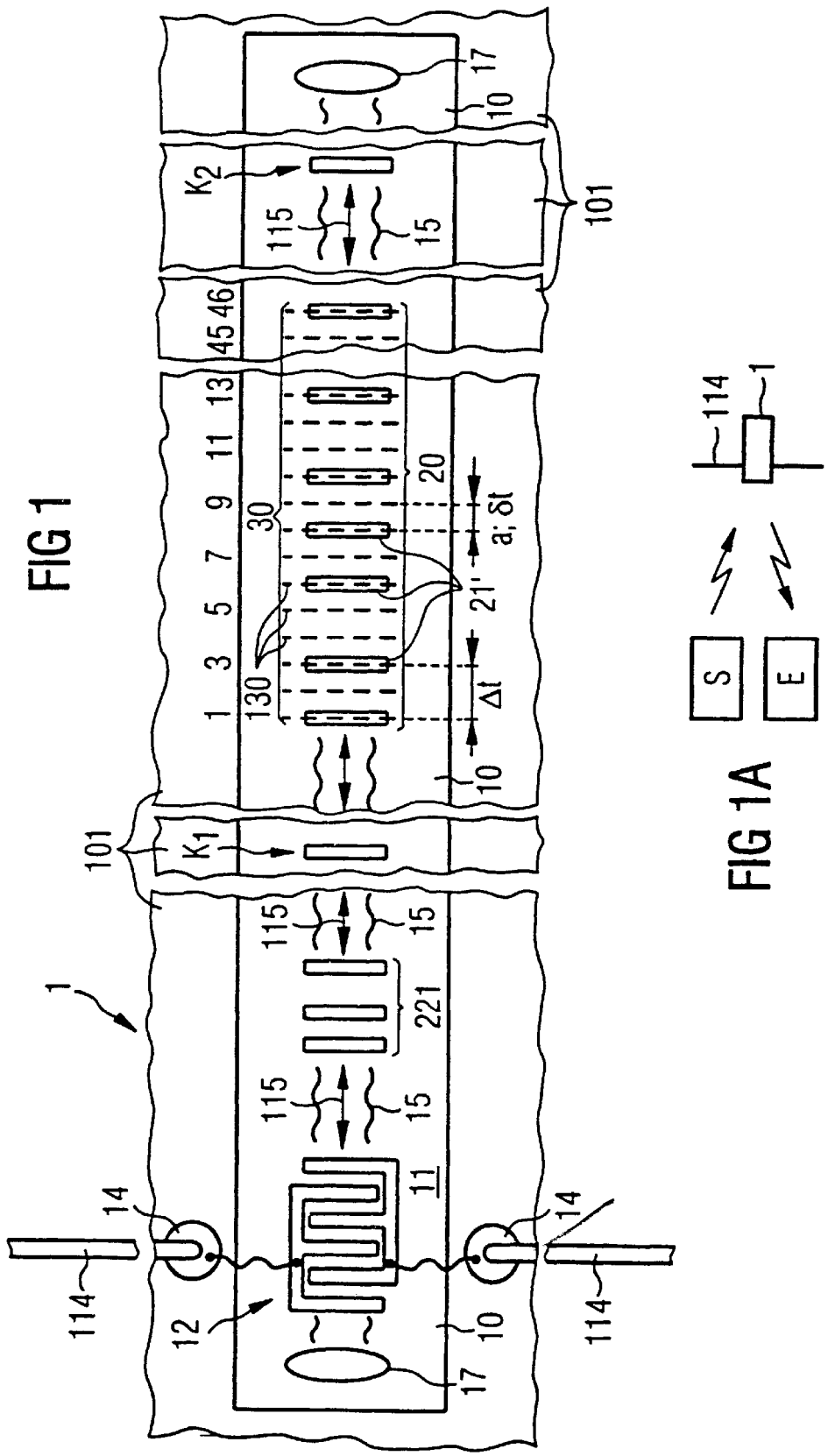
FIG. 1 is a diagrammatic, plan view of a surface acoustic wave component having reflectors according to the invention.

In all the figures of the drawing, sub-features and integral parts that correspond to one another bear the same reference symbol in each case. Referring now to the figures of the drawing in detail and first, particularly, to FIG. 1 thereof, there is shown an example of a surface acoustic wave (SAW) component 1 according to the invention. The SAW component 1 has a substrate wafer 10 composed, for example, of lithium niobate, lithium tantalate or the like, or else of quartz. These materials have the required piezoelectric characteristic. First, an electroacoustic transducer 12 is disposed on a surface 11 of the substrate wafer 10 whose plan view is illustrated. This is, for example, an interdigital structure 12 having two comb-like structures and two electrical connections 14. The connections 14 are positioned as pads on a lower base layer 101 of the substrate wafer 10, and are electrically connected to the respective comb-like structure 12. A dipole antenna 114 that needs to be provided for a component that can be interrogated by radio can be electrically connected to the connections 14. 15 denotes a respective surface acoustic wave (indicated schematically) to be produced piezoelectrically in the surface 11 of the substrate wafer 10 by the transducer 12. A double arrow 115 indicates an alignment of a main wave propagation direction. 20 denotes a code element structure overall, which contains code elements 21' positioned such that they are aligned to correspond to the wave propagation direction 115. The numbers 1, 2, 3 . . . 46 numerically denote "basic values" 130 of a matrix, which will be described in more detail further below. Of the basic values, the positions 1, 3, 6, 8, 10, 13 . . . and 46 are each occupied by one code element 21. Reflectors 21' are indicated for this purpose in FIG. 1. The distribution of the code elements 21, which is individually selected for a respective surface acoustic wave component 1 of a group of such components, over the 46 basic values, for example, corresponds to or forms an individual code within the predetermined code size, which can be provided with this group of components.

For the special way of carrying out the reading process, described above, with calibration to overcome any possible systematic errors, reflectors $K_1$ and $K_2$ are used as a start reference code element and as a stop reference code element, as reference elements.

For the sake of completeness, further structure elements should also be mentioned, such as the reflectors which, in a manner known per se, are part of a sensor structure 221 which is used, for example, for temperature measurement, force measurement or the like. 17 denotes conventional wave sumps for the surface acoustic wave.

FIG. 1a an overview of a system, which contains the surface acoustic wave component 1, a transmitter S and a receiver E required for radio interrogation.

Figure 2:
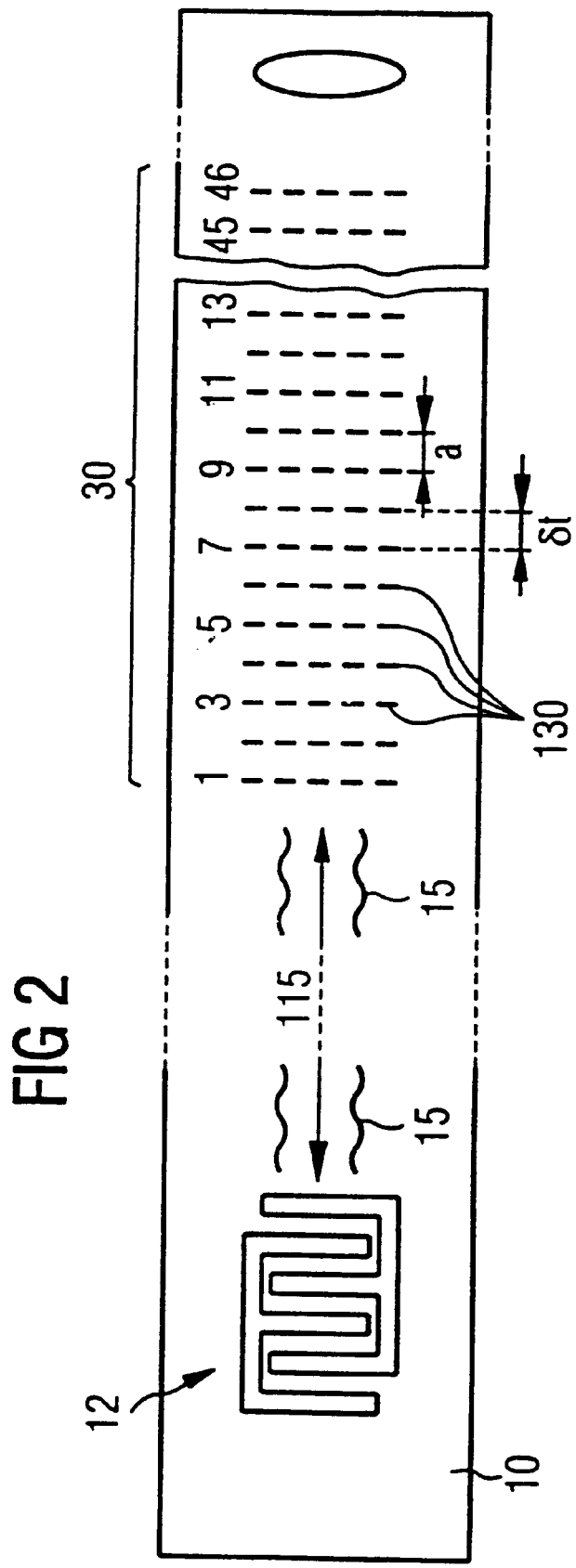
FIG. 2 is a plan view used to complete the explanation of the definition of a position matrix.

FIG. 2 shows, from the same view as that of the exemplary embodiment in FIG. 1, only the substrate wafer 10 and the interdigital structure 12 of the transducer (since this governs the main wave propagation direction 115 in the surface 11 of the substrate wafer 10). Instead of the code element structure 20 (which has not yet been described here) from FIG. 1, a position matrix 30 according to the invention and defined for reflectors for the invention is indicated with the basic position values 130 which, as in FIG. 1, are annotated 1, 2, 3 . . . up to 46. The individual basic values 130 are each represented by a (center) line thereof. The matrix 30 according to the invention is defined such that, first, it is aligned in the main wave propagation direction 115 of the wave 15 produced by the transducer 12. Since the wave propagation direction 115 is in this case linear, the position matrix 30 is a linear matrix. A different configuration may also occur in special cases, but the matrix always follows the wave propagation in such a manner that reflectors as code elements at the occupied positions of the basic values 130 can cause the surface acoustic wave 15 to be reflected in a manner known per se.

The linear matrix 30 has as many basic values 130 as required for the predetermined code size taking account of a further distribution condition, according to the invention, for the individual code elements. In accordance with the definition provided by the invention, the equidistant intervals a between the basic values 130 are dimensioned such that the magnitude of the respective distance between adjacent basic values (1 and 2, 2 and 3, . . . ) is equal to a movement distance δt which the surface acoustic wave 15 travels within a defined time period. For delay time measurement with the reflectors 21' as the code elements 21, the time period is the measurement inaccuracy δ measured in time as defined above or determined by timing details for the system, which includes the surface acoustic wave component 1 together with the transmitter S and receiver E.

As stated with the teaching of the invention, the basic values 130 of the position matrix 30 may each be occupied with a code element 21 only at intervals Δt corresponding to the structure resolution. If δt≦½ Δt, one or more basic values 130 are kept free between two basic values 130 occupied by the code elements 21.

As an illustrative example FIG. 3 shows, alongside one another, two position matrices 30' and 30" which each have (for the sake of simplicity only) 13 of the matrix basic values 130. Of these, there are preferably an equal number of positions in the respective matrix which are occupied with the code elements 21, that is to say with the reflectors 21', in each of the two matrices, namely in each case six basic values 130. However, the occupancy distribution differs depending on the different code in the two matrices 30', 30".

Figure 4:
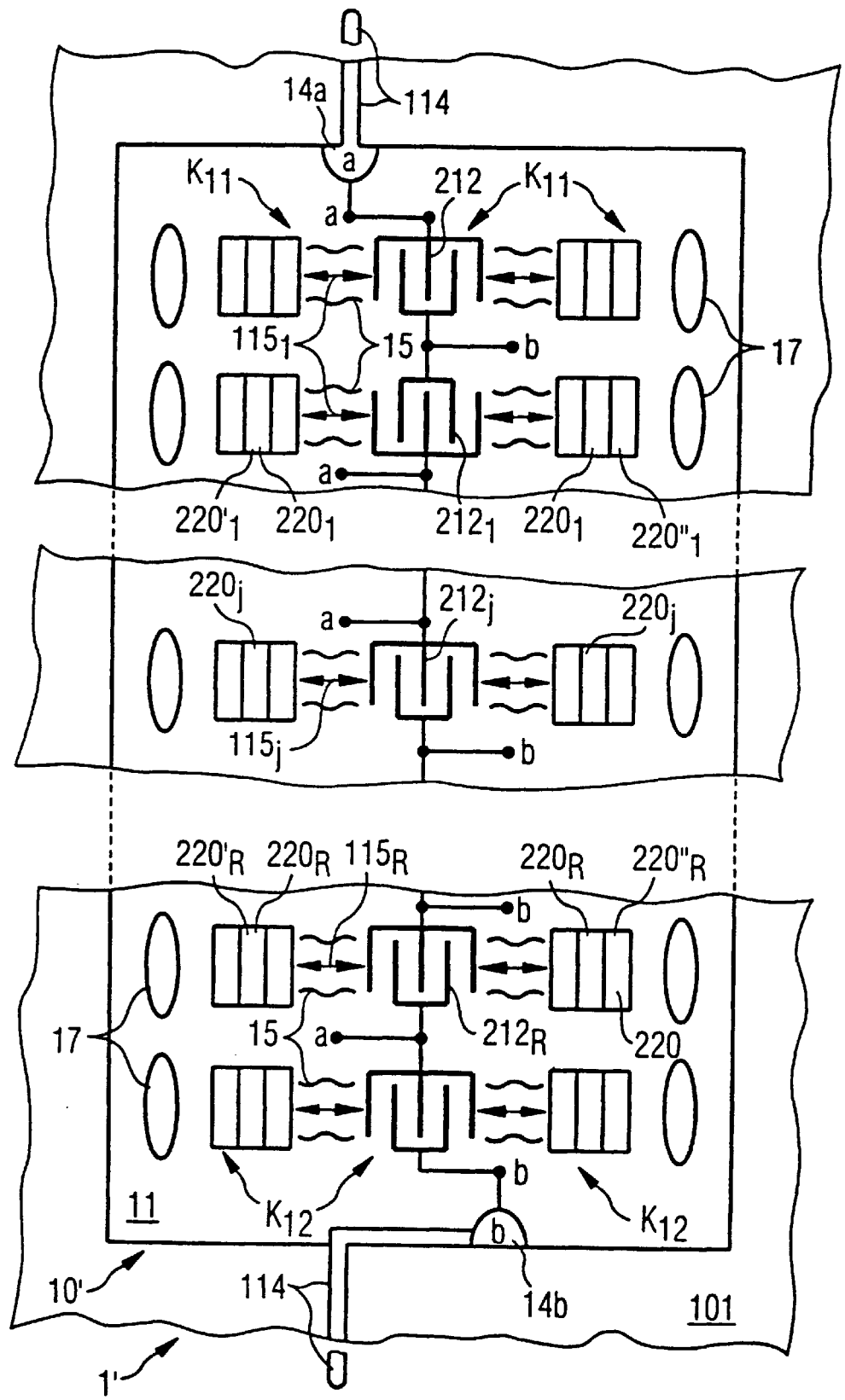
FIG. 4 is a plan view of a physical configuration of the surface acoustic wave component coded having resonators as the code elements.

As an example, FIG. 4 shows an embodiment with resonators instead of the reflectors 21' as shown in the previous figures.

FIG. 4 shows a plan view of a surface acoustic wave component 1' having resonators 220. 10' denotes a substrate wafer on whose surface 11 transducers 212, the resonators 220, the connections 14 for the dipole antenna 114 and the wave sumps 17 for wave attenuation are disposed. A transducer $212_1$, and the two resonator elements $220_1$' and $220_1$" which form a resonator $220_1$ are shown in the second line of FIG. 4. 115 indicates the main wave propagation direction, and 15 the associated surface acoustic wave. The two elements of the resonator $220_1$ contain reflector strips, which are normal for such a component and are spaced apart from one another, and the resonator is tuned, for example to a selected frequency $f_1$, by selection of a distance between the strips. The resonator $220_1$ is a first code element of the coded component 1' shown in FIG. 4. A j-th code element is shown in the line underneath, with the resonator $220_j$, which once again is composed of two elements, and its transducer $212_j$ that is required to produce the wave 15. The frequency $f_j$ is also selected from the frequency matrix according to the invention. The R-th code element of the component 1' is shown in the fourth line. Once again, the resonator contains two elements $220_R$. The resonator $220_R$ is tuned to the frequency $f_R$, which is likewise selected in the predetermined frequency matrix according to the invention. The resonant frequencies of these resonators are thus surface acoustic wave structures tuned in a manner known per se and having frequencies $f_1$ to $f_R$ which differ from one another. The selected frequencies produce the overall code of the individual surface acoustic wave component. The transducers $212_1$ to $212_R$ can be connected in series or else in parallel in the manner shown. A physically single transducer construction can also be provided, but this covers the illustrated main wave propagation directions $115_1$ to $115_R$. Normally, the bandwidth of such a transducer 212 is so large that even identically configured transducers can form the transducer chain.

A frequency matrix 230 according to the invention in FIG. 5 and which is relevant for the embodiment with resonators is analogous to the position matrix 30 in FIG. 2. The matrix interval $\delta f$ in a frequency domain, which is relevant to the invention, is obtained from the measurement inaccuracy of the system, containing the transmitter, the receiver and the component, or from the measurement inaccuracy which can be achieved by multiple measurements or by averaging, comparable to the interval between the basic values 130 resulting from the time measurement uncertainty, in FIG. 2. Based on the embodiments in FIGS. 1 and 2, 46 frequencies $f_i$ are also indicated, by way of example, in FIG. 5. The total number of such frequencies $f_i$ which are required for the component 1' in order to select the total number R of resonant frequencies for its resonators $220_1$ to $220_R$ is once again governed by the predetermined code size in this case. In order to allow the component 1 or 1' as shown in FIG. 1 or FIG. 4, respectively, to be kept as geometrically small as possible, the total number R is also selected to be as low as possible in this case and, by the invention, this can be achieved with reduced measurement inaccuracy $\delta$ with, for example, an unchanged coarse structure resolution $\Delta$.

Accordingly, the "occupancy" of the possible basic values in the frequency matrix shown in FIG. 5 is subject to the limitation that the frequency interval between two adjacent frequencies $f_j$ and $f_{j+1}$ (j=from 1 to R) used for resonators must be $\Delta f$, where $\Delta f$ is at least of equal magnitude to the structure resolution resulting from the quality factor of the system. The structure resolution is the frequency interval $\Delta f$ which is required in order to make it possible to distinguish between two resonant frequencies, which differ from one another, in the system. For example, compared with the component 1 described above and having the reflectors 21' with a minimum permissible position interval corresponding to the time duration $\Delta t$, an occupancy of the frequency positions $f_1$ to $f_{46}$ in the matrix as shown in FIG. 5 can be used with a minimum frequency interval $\Delta f=2\times\delta f$ for an embodiment with resonators, if the frequency measurement inaccuracy of the system is half the magnitude of the frequency structure resolution $\Delta f$.

In the case of a component with resonators as reference elements, resonators $K_{11}$ and $K_{12}$ are used as start and stop elements, respectively, for carrying out the reading process with calibration.

In a comparable manner to FIG. 3, FIG. 6 shows the frequency scheme for two different codes from a predetermined code size with six predetermined resonators as code elements of the code. For example, these are the various codes of the components 1(n) and 1(n+1) of a total number N of coded surface acoustic wave components 1' for a predetermined code size.

The use of the invention also results in advantages relating to the configuration of the production process. For example, when producing a component coded according to the invention, the exposure time for production of the code elements (reflectors/resonators) is reduced, for example being halved. This is achieved due to the fact that, for example, two reflectors 21' are always placed jointly on the exposure mask, and are exposed jointly. For this purpose, these two reflectors 21' must be provided with intervals that differ from one another, to be precise with minimum intervals corresponding to the rule according to the invention on the exposure mask. If, for example, the structure resolution is 1 μs and the number of code elements is P=4 per interval $\Delta$ of the structure resolution, then exposure masks must be provided which each have two reflectors, which can be exposed at the same time, for the reflector intervals of 1.00, 1.25, 1.50, 1.75 and, possibly, also 2.00 μs.

We claim:

1. A coded surface acoustic wave component for an ID tag radio interrogation system, the coded surface acoustic wave component comprising:
    a substrate wafer having a surface with a piezoelectric material characteristic;
    at least one electroacoustic transducer having an interdigital structure disposed on said surface of said substrate wafer, said electroacoustic transducer producing a surface acoustic wave in said surface with a main wave propagation direction governed by said interdigital structure; and
    a reflector structure having reflectors functioning as code elements and spaced apart from one another in said main wave propagation direction on said surface of said substrate wafer;
    said substrate wafer having a position matrix for positioning said reflectors at correct distances apart, said position matrix having basic values at equal distances from one another aligned in said main wave propagation direction, in said position matrix a size of a matrix spacing is dimensioned on a basis of a movement distance which the surface acoustic wave travels within a time period predetermined by a time-dimensioned measurement inaccuracy of a system, and of the basic values of said position matrix only the basic values occupied by said reflectors as positions distributed corresponding to a respective code are those for which distances between adjacent reflectors are always at least of equal magnitude to a structure resolution resulting from a frequency bandwidth of the system.

2. The component according to claim 1, wherein an equal number of said code elements are in each case assigned to individual codes with a predetermined code size.

3. The component according to claim 2, wherein said substrate wafer has a minimum physical length in a direction of said position matrix resulting from said interdigital structure of said electroacoustic transducer and the predetermined code size with regard to said position matrix.

4. The component according to claim 1, including at least one sensor structure disposed on said surface of said substrate wafer.

5. The component according to claim 1, wherein said code elements can be additionally weighted for enlarging a code size.

6. The component according to claim 1, including reference elements disposed on said substrate wafer.

7. A coded surface acoustic wave component for an ID tag radio interrogation system, comprising:
   a substrate wafer having a surface with a piezoelectric material characteristic;
   electroacoustic transducers having interdigital structures disposed on said surface of said substrate wafer, said elecrtoacoustic transducers producing surface acoustic waves in said surface with main wave propagation directions governed by said interdigital structures; and
   resonator structures functioning as code elements each having a resonant frequency, said resonator structures each with respect to a respective one of said electroacoustic transducers, being disposed in a respective main wave propagation direction thereof, said resonator structures formed according to a frequency matrix having frequencies at equal intervals from one another as basic values of said frequency matrix for determining individual resonant frequencies of said resonator structures, a size of a frequency interval between said basic values within said frequency matrix dimensioned on a basis of a measurement inaccuracy with which a frequency can be measured in a system, and in said frequency matrix said resonant frequency for each of said resonator structures selected such that, within said frequency matrix, only resonant frequencies which are used for said resonator structures are those that a respective frequency separation between two of said resonator structures provided for adjacent resonant frequencies is at least of equal magnitude to a structure resolution of a frequency measurement resulting from a resonance duration of an individual resonator in the system.

8. The component according to claim 7, wherein an equal number of said code elements are in each case assigned to individual codes within a predetermined code size.

9. The component according to claim 7, including at least one sensor structure disposed on said substrate wafer.

10. The component according to claim 7, wherein said code elements can be additionally weighted for enlarging a code size.

11. The component according to claim 7, including reference elements disposed on said substrate wafer.

12. A method for carrying out a determination of a respective code of a coded surface acoustic wave component, which comprises the steps of:
   detecting response signals of individual code elements of the respective code a number of times successively;
   forming an average value from the response signals for each code element resulting in a plurality of average values; and
   determining a measure representing a measurement inaccuracy from the response signals of the individual code elements of the respective code.

13. The method according to claim 12, which comprises deriving the measure representing the measurement inaccuracy as a mean deviation between measured values of the response signals of each code element and its mean value (=statistical standard deviation).

14. The method according to claim 12, which comprises detecting the response signals of the individual code elements a large number of times in such a manner that a determined mean measurement inaccuracy of all the averaged values is reduced to a measure such that the measure is less than a predetermined measure of the measurement inaccuracy on a basis of which a matrix size of the coded surface acoustic wave component is formed.

15. The method according to claim 13, which comprises detecting the response signals of the individual code elements a large number of times in such a manner that a determined mean measurement inaccuracy of a representative mean value is reduced to a measure such that the measure is less than a predetermined measure of the measurement inaccuracy on a basis of which a matrix size of the coded surface acoustic wave component is formed.

16. The method according to claim 12, which comprises:
   carrying out the determination of the respective code of the coded surface acoustic wave component having reference elements;
   interrogating the reference elements a number of times successively and at least one of averaged scaling values and offset values are determined from the response signals obtained a number of times; and
   correcting the response signals of the code elements using the averaged scaling values and the offset values.

17. The method according to claim 14, which comprises detecting the response signals of the individual code elements a large number of times in such a manner that a determined mean measurement inaccuracy of a representative mean value is reduced to a measure such that the measure is less than a predetermined measure of the measurement inaccuracy on a basis of which a matrix size of the coded surface acoustic wave component is formed.

* * * * *